United States Patent
Jiang et al.

(10) Patent No.: US 9,593,405 B2
(45) Date of Patent: Mar. 14, 2017

(54) PINHOLE-FREE DIELECTRIC THIN FILM FABRICATION

(75) Inventors: Chong Jiang, Cupertino, CA (US); Byung-Sung Leo Kwak, Portland, OR (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 13/523,790

(22) Filed: Jun. 14, 2012

(65) Prior Publication Data

US 2012/0318664 A1    Dec. 20, 2012

Related U.S. Application Data

(60) Provisional application No. 61/498,480, filed on Jun. 17, 2011.

(51) Int. Cl.
*C23C 14/00* (2006.01)
*C23C 14/32* (2006.01)
(Continued)

(52) U.S. Cl.
CPC .......... *C23C 14/0676* (2013.01); *C23C 14/08* (2013.01); *C23C 14/586* (2013.01); *C23C 14/5826* (2013.01)

(58) Field of Classification Search
CPC ..................................................... C23C 14/34
(Continued)

(56) References Cited

U.S. PATENT DOCUMENTS 4,824,546 A    4/1989 Ohmi
5,116,482 A    5/1992 Setoyama et al.
(Continued)

FOREIGN PATENT DOCUMENTS

JP    H01-319678 A    12/1989
JP    02-036549    2/1990
(Continued)

OTHER PUBLICATIONS

Thiβen, A., et al. "Experimental routes to in situ characterization of the electronic structure and chemical composition of cathode materials for lithium ion batteries during lithium intercalation and deintercalation using photoelectron spectroscopy and related techniques." Ionics 15.4 (2009): 393-403.*

(Continued)

*Primary Examiner* — Ibrahime A Abraham
(74) *Attorney, Agent, or Firm* — Pillsbury Winthrop Shaw Pittman LLP

(57) ABSTRACT

A method of depositing a dielectric thin film may include: depositing a thin layer of dielectric; stopping deposition of the dielectric layer, and modifying the gas in the chamber if desired; inducing and maintaining a plasma in the vicinity of the substrate to provide ion bombardment of the deposited layer of dielectric; and repeating the depositing, stopping and inducing and maintaining steps until a desired thickness of dielectric is deposited. A variation on this method may include, in place of the repeating step: depositing a thick layer of lower quality dielectric; depositing a thin layer of high quality dielectric; stopping deposition of the dielectric layer, and modifying the gas in the chamber if desired; and inducing and maintaining a plasma in the vicinity of the substrate to provide ion bombardment of the deposited layer of dielectric. The thick layer of dielectric may be deposited more rapidly than the thin layers.

16 Claims, 8 Drawing Sheets

(51) Int. Cl.
*C23C 14/06* (2006.01)
*C23C 14/08* (2006.01)
*C23C 14/58* (2006.01)

(58) Field of Classification Search
USPC ...................................................... 204/192.1
See application file for complete search history.

(56) References Cited

U.S. PATENT DOCUMENTS

| | | | |
|---|---|---|---|
| 5,178,739 | A | 1/1993 | Barnes et al. |
| 6,376,027 | B1 * | 4/2002 | Lee .................... C23C 14/08 427/255.31 |
| 6,506,289 | B2 | 1/2003 | Demaray et al. |
| 6,827,826 | B2 | 12/2004 | Demaray et al. |
| 6,863,399 | B1 | 3/2005 | Newsome |
| 7,247,221 | B2 | 7/2007 | Stowell, Jr. |
| 7,303,839 | B2 | 12/2007 | Lee et al. |
| 7,469,558 | B2 | 12/2008 | Demaray et al. |
| 7,476,602 | B2 | 1/2009 | Ajmera et al. |
| 2002/0145834 | A1 * | 10/2002 | Inoue et al. .................. 360/320 |
| 2004/0018424 | A1 | 1/2004 | Zhang et al. |
| 2005/0186469 | A1 * | 8/2005 | De Jonghe et al. .......... 429/137 |
| 2006/0172552 | A1 * | 8/2006 | Ajmera et al. ................ 438/778 |
| 2009/0288943 | A1 | 11/2009 | Kwak et al. |
| 2010/0233548 | A1 | 9/2010 | Pijnenburg et al. |
| 2010/0285237 | A1 | 11/2010 | Ditizio et al. |
| 2013/0280581 | A1 | 10/2013 | Sun et al. |

FOREIGN PATENT DOCUMENTS

| | | |
|---|---|---|
| JP | H04-29319 A | 1/1992 |
| JP | 2004-139968 A | 5/2004 |
| JP | 2007-273249 A | 10/2007 |
| JP | 2011-108533 A | 6/2011 |

OTHER PUBLICATIONS

Hui Xia, Li Lu, G. Ceder, Li diffusion in LiCoO2 thin films prepared by pulsed laser deposition, Journal of Power Sources, vol. 159, Issue 2, Sep. 22, 2006, pp. 1422-1427, ISSN 0378-7753, http://dx.doi.org/10.1016/j.jpowsour.2005.12.012.*

Dudney, N.J., "Solid-State Thin-Film Rechargeable Batteries," Materials Science and Engineering B 116, (2005) pp. 245-249.

Werbaneth, P. et al.; "The Reactive Ion Etching of Au on GaAs Substrates in a High Density Plasma Etch Reactor," The International Conference on Compound Semiconductor Manufacturing Technology, St Louis, 1999, 4 pages. Available at: http://gaasmantech.com/Digests/1999/PDF/12.pdf, last viewed on Jul. 11, 2012.

International Search Report and Written Opinion issued Jan. 30, 2013 for PCT/US2012/042487.

Park, M., et al., "A Review of Conduction Phenomena in Li-ion Batteries," Journal of Power Resources, vol. 195, 2010, pp. 7904-7929.

International Search Report and Written Opinion for PCT/US2014/069566, Mar. 2015.

* cited by examiner

PINHOLE-FREE DIELECTRIC THIN FILM FABRICATION

CROSS-REFERENCE TO RELATED APPLICATIONS

This application claims the benefit of U.S. Provisional Application No. 61/498,480 filed Jun. 17, 2011, incorporated herein by reference in its entirety.

FIELD OF THE INVENTION

Embodiments of the present invention relate generally to thin film deposition and more specifically to methods and equipment for reducing pinholes in dielectric thin films.

BACKGROUND OF THE INVENTION

There are many thin film devices that include a dielectric film between conducting layers—for example, thin film batteries (TFBs) and electrochromic devices. For these devices, a pinhole in the dielectric film can compromise the function. For example, a pinhole in the dielectric film can reduce the breakdown voltage of the device, or worse still lead to a short between conducting layers and render the device useless.

FIG. 1 shows a cross-sectional representation of a typical thin film battery (TFB). The TFB device structure 100 with anode current collector 103 and cathode current collector 102 are formed on a substrate 101, followed by cathode 104, electrolyte 105 and anode 106; although the device may be fabricated with the cathode, electrolyte and anode in reverse order. Furthermore, the cathode current collector (CCC) and anode current collector (ACC) may be deposited separately. For example, the CCC may be deposited before the cathode and the ACC may be deposited after the electrolyte. The device may be covered by an encapsulation layer 107 to protect the environmentally sensitive layers from oxidizing agents. See, for example, N. J. Dudney, Materials Science and Engineering B 1 16, (2005) 245-249. Note that the component layers are not drawn to scale in the TFB device shown in FIG. 1.

In a typical TFB device structure, such as shown in FIG. 1, the electrolyte—a dielectric material such as Lithium Phosporous Oxynitride (LiPON)—is sandwiched between two electrodes—the anode and cathode. The conventional method used to deposit LiPON is physical vapor deposition (PVD) radio frequency (RF) sputtering of a $Li_3PO_4$ target in a $N_2$ ambient. However, this deposition process can lead to a very significant yield loss due to pinholes in the UPON films, and pinhole density increases with application of increasing RF power during sputtering. One approach to minimizing pinholes involves depositing thicker films of UPON—typically one to two microns thick—and when the cathode has poor surface morphology the thickness of the LiPON may need to be greater yet. However, this is still not completely effective in removing pinholes and increases the cost of the process step due to lower throughput and more costly overhead in terms of consumed materials.

A further approach to minimizing pinholes in dielectric thin films is to increase the temperature of the substrate during deposition so as to increase the surface mobility of atoms. However, this approach does not work for materials such as LiPON, since an "amorphous" phase of LiPON is required for TFBs, and the temperatures required to substantially increase surface mobility of UPON results in undesired crystallization of the UPON. Also, this approach does not work for permeation barrier layers since temperatures high enough to increase the surface mobility of the dielectric negatively affect the polymer planarization layers.

Furthermore, there are thin film structures such as permeation barrier layers (multiple repeating layers of dielectric and planarizing polymer films) for which a pinhole in the dielectric film can compromise the function. For example, a pinhole in the dielectric film can readily lead to a hole through a permeation barrier layer.

Clearly, there is a need for deposition processes and equipment which can provide dielectric thin films with lower pinhole densities at low cost.

SUMMARY OF THE INVENTION

The present invention relates, in general, to reduction of pinhole density and improve surface morphology of thin films of dielectric materials. The present invention is applicable generally to vacuum deposited dielectric thin films, is agnostic to the particular vacuum deposition technique that is used, and may also be applicable to non-vacuum deposited thin films. As a specific example, methods for sputter depositing low pinhole density LiPON, which is a dielectric, electrolyte material used in thin film electrochemical devices, such as electrochromic (EC) devices and TFBs, is described herein.

According to some embodiments of the present invention, a method of depositing a dielectric thin film may include: depositing a thin layer of dielectric; stopping deposition of the dielectric layer, and modifying the gas in the chamber if desired; inducing and maintaining a plasma in the vicinity of the substrate to provide ion bombardment of the deposited layer of dielectric; and repeating the depositing, stopping and inducing steps until a desired thickness of dielectric is deposited.

According to further embodiments of the present invention, a method of depositing a dielectric thin film may include: depositing a thin layer of high quality dielectric; stopping deposition of the dielectric layer, and modifying the gas in the chamber if desired; inducing and maintaining a plasma in the vicinity of the substrate to provide ion bombardment of the deposited layer of dielectric; depositing a thick layer of lower quality dielectric; depositing a thin layer of high quality dielectric; stopping deposition of the dielectric layer, and modifying the gas in the chamber if desired; and inducing and maintaining a plasma in the vicinity of the substrate to provide ion bombardment of the deposited layer of dielectric. The thick layer of dielectric may be deposited more rapidly than the thin layers.

Furthermore, this invention describes tools configured for carrying out the above methods.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

Embodiments of the present invention will now be described in detail with reference to the drawings, which are provided as illustrative examples of the invention so as to enable those skilled in the art to practice the invention. The drawings provided herein include representations of devices and device process flows which are not drawn to scale. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

The present invention is applicable generally to the reduction of pinholes in dielectric thin films. Although specific examples of processes are provided for deposition of LiPON thin films, the processes of the present invention are applicable to the deposition of other dielectric thin films, such as $SiO_2$, $Al_2O_3$, $ZrO_2$, $Si_3N_4$, SiON, $TiO_2$, etc. Furthermore, although the specific example of PVD RF sputtering of a $Li_3PO_4$ target in nitrogen ambient is provided for LiPON, the method of the present invention is agnostic to the specific deposition method for the dielectric thin layer—the method of the present invention for reduction of pinholes is applicable generally to vacuum deposition of thin films and may also be applicable to non-vacuum deposited thin films, for example wet processed thin films.

Figure 1:
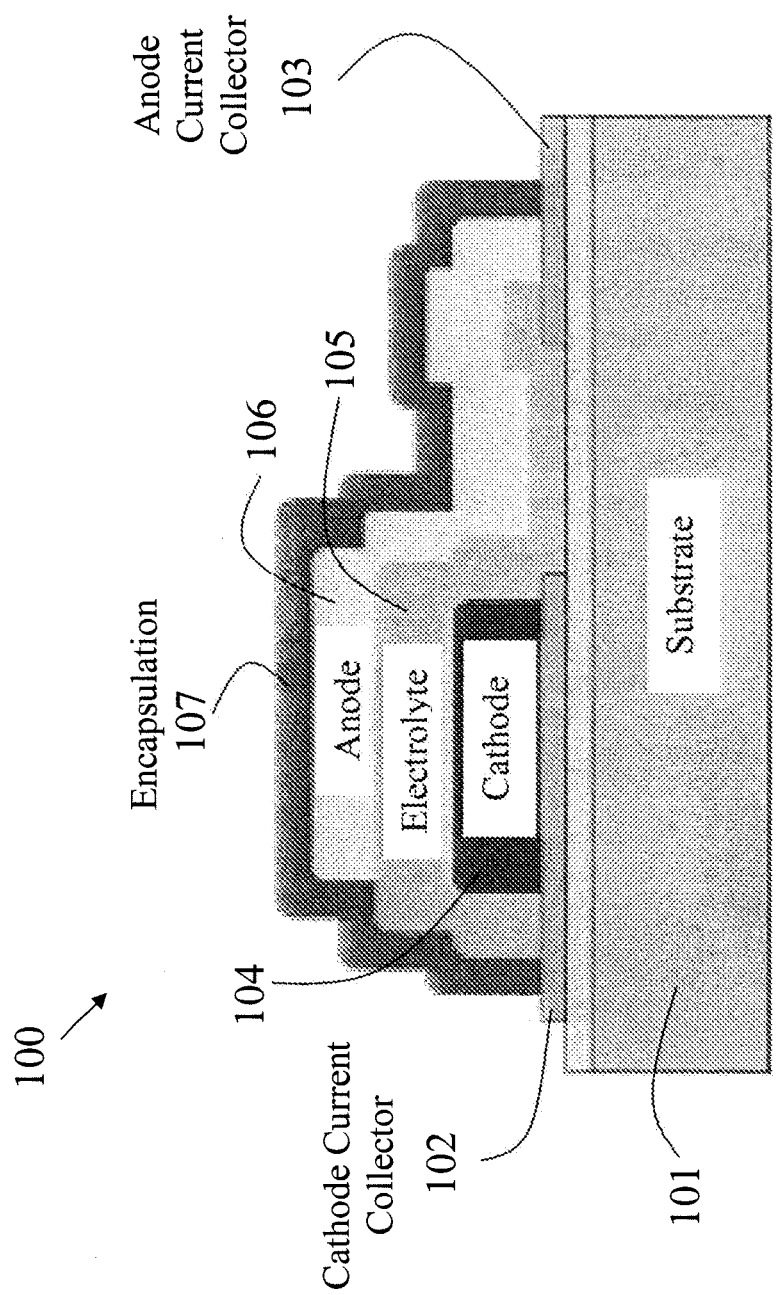
FIG. 1 is a cross-sectional representation of a thin film battery.
Figure 2:
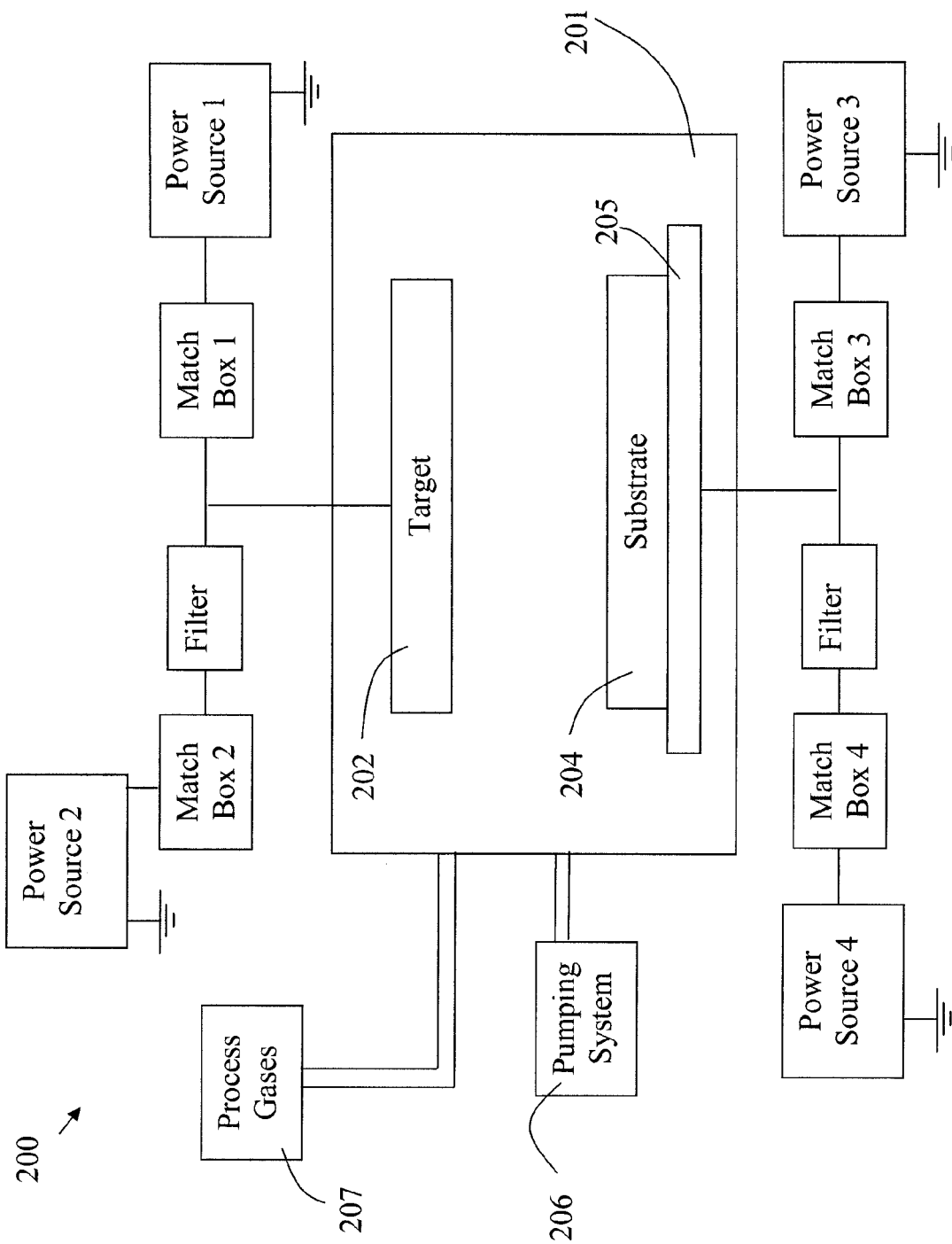
FIG. 2 is a schematic representation of a deposition system, according to some embodiments of the present invention.

FIG. 2 shows a schematic representation of an example of a deposition tool 200 configured for deposition methods according to the present invention. The deposition tool 200 includes a vacuum chamber 201, a sputter target 202, a substrate 204 and a substrate pedestal 205. For LiPON deposition the target 202 may be $Li_3PO_4$ and a suitable substrate 204 may be silicon, silicon nitride on Si, glass, PET (polyethylene terephthalate), mica, metal foils, etc., with current collector and cathode layers already deposited and patterned. See FIG. 1. The chamber 201 has a vacuum pump system 206 and a process gas delivery system 207. Multiple power sources are connected to the target. Each target power source has a matching network for handling radio frequency (RF) power supplies. A filter is used to enable use of two power sources operating at different frequencies, where the filter acts to protect the target power supply operating at the lower frequency from damage due to higher frequencies. Similarly, multiple power sources are connected to the substrate. Each power source connected to the substrate has a matching network for handling radio frequency (RF) power supplies. A filter is used to enable use of two power sources operating at different frequencies, where the filter acts to protect the power supply connected to the substrate operating at the lower frequency from damage due to higher frequencies.

Depending on the type of deposition and plasma pinhole reduction techniques used, one or more of the power sources connected to the substrate can be a DC source, a pulsed DC (pDC) source, an RF source, etc. Similarly, one or more of the target power sources can be a DC source, a pDC source, an RF source, etc. Some examples of configurations and uses of the power sources (PS) are provided below in Table 1. Furthermore, the concepts and configurations of the combinatorial power supplies described in U.S. Patent Application Publication No. 2009/0288943 to Kwak et al., incorporated herein by reference in its entirety, may be used in the deposition of the thin films according to some embodiments of the present invention; for example, combinations of sources other than RF sources may be effective in providing reduced pinhole density in deposited films. In addition, the substrate may be heated during deposition.

TABLE 1

| Process | Power Source 1 | Power Source 2 | Power Source 3 | Power Source 4 |
|---|---|---|---|---|
| Sputter Deposition #1 | RF source at a first frequency | RF source at a second frequency | DC source or pDC source | RF source |
| Plasma Pinhole Filling #1 | | | | RF source |
| Sputter Deposition #2 | RF source at a first frequency | RF source at a second frequency | RF source at a different frequency* | RF source |
| Plasma Pinhole Filling #2 | | | | RF source |

*A frequency of less than 1 MHz may be used.

Table 1 provides example configurations of power sources for sputter deposition and plasma pinhole filling processes according to some embodiments of the present invention. Sputter depositions #1 and #2 may be used to sputter deposit a material such as LiPON using a $Li_3PO_4$ target in a nitrogen or argon ambient (the latter requiring a subsequent nitrogen plasma treatment, which may also be part of the pinhole filling process, to provide the necessary nitrogen); the corresponding plasma pinhole filling processes may be used to reduce the pinhole density in these sputter-deposited LiPON films.

Figure 3:
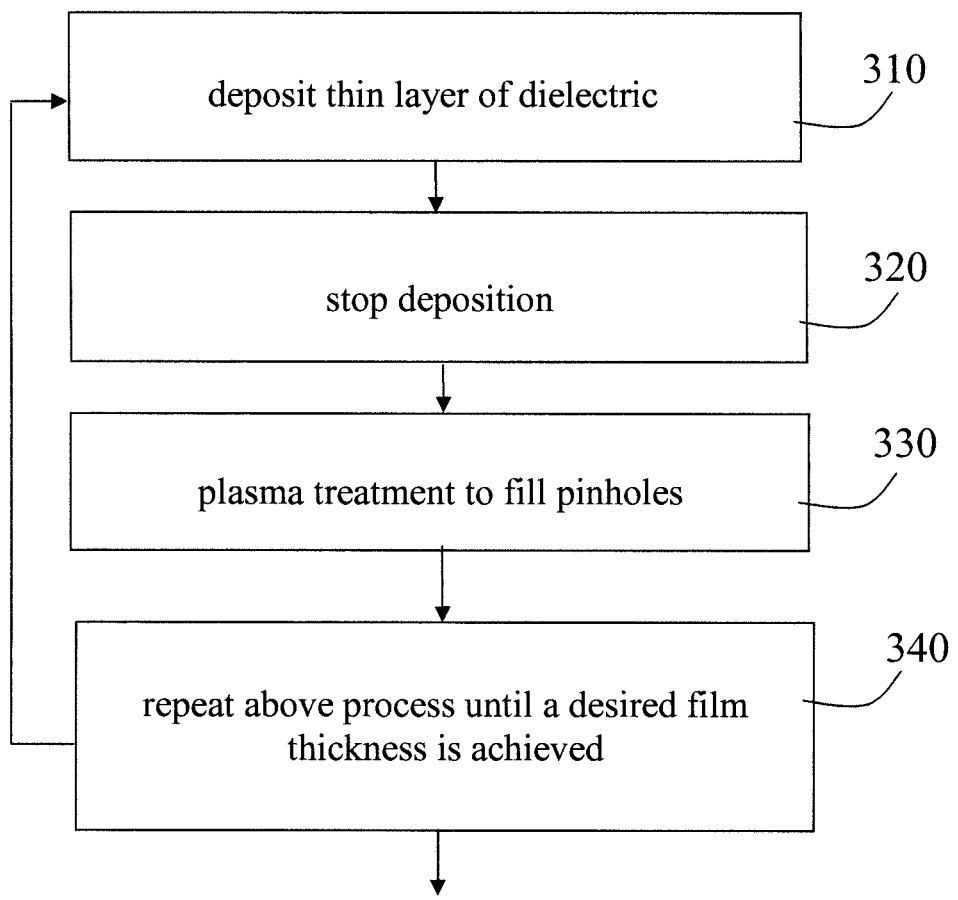
FIG. 3 is a flow chart for deposition of a LiPON thin film, according to some embodiments of the present invention.

A first embodiment of the present invention reduces the density of formed pinholes with post-deposition plasma induced surface modification according to the general process flow of FIG. 3. The process flow may include: deposition of a thin layer of dielectric (310); stop deposition of the dielectric layer, and modify the gas in the chamber if desired (320); induce and maintain a plasma over the substrate to provide ion bombardment of the deposited layer of dielectric for restructuring the surface morphology of the dielectric layer and in some embodiments compositional modification, like nitrogen incorporation (330); and repeat steps (310) through (330) until a desired thickness of dielectric is deposited (340). Herein, the thin layer of dielectric refers to a layer of dielectric with a thickness of a few nanometers to a few hundred nanometers, and more specifically to a layer of thickness 2 nm to 200 nm.

An example of the process of FIG. 3 is given for LiPON thin layer deposition. First, a thin layer of LiPON is deposited by PVD RF sputtering of a $Li_3PO_4$ target in nitrogen ambient. Second, the RF target power source is turned off, while maintaining the $N_2$ ambient. Third, RF is applied directly to the substrate using an RF substrate power source to generate a localized plasma at the substrate—this plasma generates sufficiently energetic ions to impart sufficient energy to the deposited LiPON layer to enable smoothing of the surface and repair of pinholes, as described in more detail below with reference to FIG. 5. Fourth, the process is repeated as described above until the desired thickness is reached—this may be after one deposition and plasma treatment, two depositions and plasma treatment cycles, or may even require up to ten or more repetitions. Note that using a nitrogen plasma for pinhole reduction may also improve the ionic conductivity of the deposited LiPON by increasing the nitrogen content of the LiPON.

Instead of sputtering $Li_3PO_4$ in nitrogen ambient to form the LiPON film, argon ambient may be used, followed by a nitrogen plasma pinhole filling process. Sputtering with argon has been found to improve the efficacy of the pinhole reduction. This may be because nitrogen poisons the $Li_3PO_4$ target which can result in particle generation by the target and these particles can result in pinholes in the deposited films, whereas argon does not poison the target, and thus, leads to reduced particle shedding and reduced pinhole formation. Furthermore, films formed by sputtering $Li_3PO_4$ using argon ambient and then treated with nitrogen plasma for pinhole removal showed an improved ionic conductivity over films sputter deposited using nitrogen ambient but without the nitrogen plasma pinhole removal treatment. The improved conductivity may be due to more effective incorporation of nitrogen into the LiPON film during the nitrogen plasma treatment. (To a certain extent, the higher the nitrogen content—i.e., higher x in $Li_3PO_{4-\delta}N_x$—the higher the ionic conductivity.) Note that the efficiency of the nitrogen plasma process for pinhole removal and improved ionic conductivity may be increased by controlling the substrate temperature. For LiPON deposition, higher temperature improves nitrogen incorporation, although the temperature should not be too high otherwise the film may crystallize—controlling the substrate temperature to a temperature within the range of room temperature to 300° C. may provide a more efficient process for LiPON. Furthermore, it is expected that similar results may be obtained using other gases, such as xenon, substituted for argon, although the high cost of gases such as xenon compared with argon may limit their use.

Figure 4:
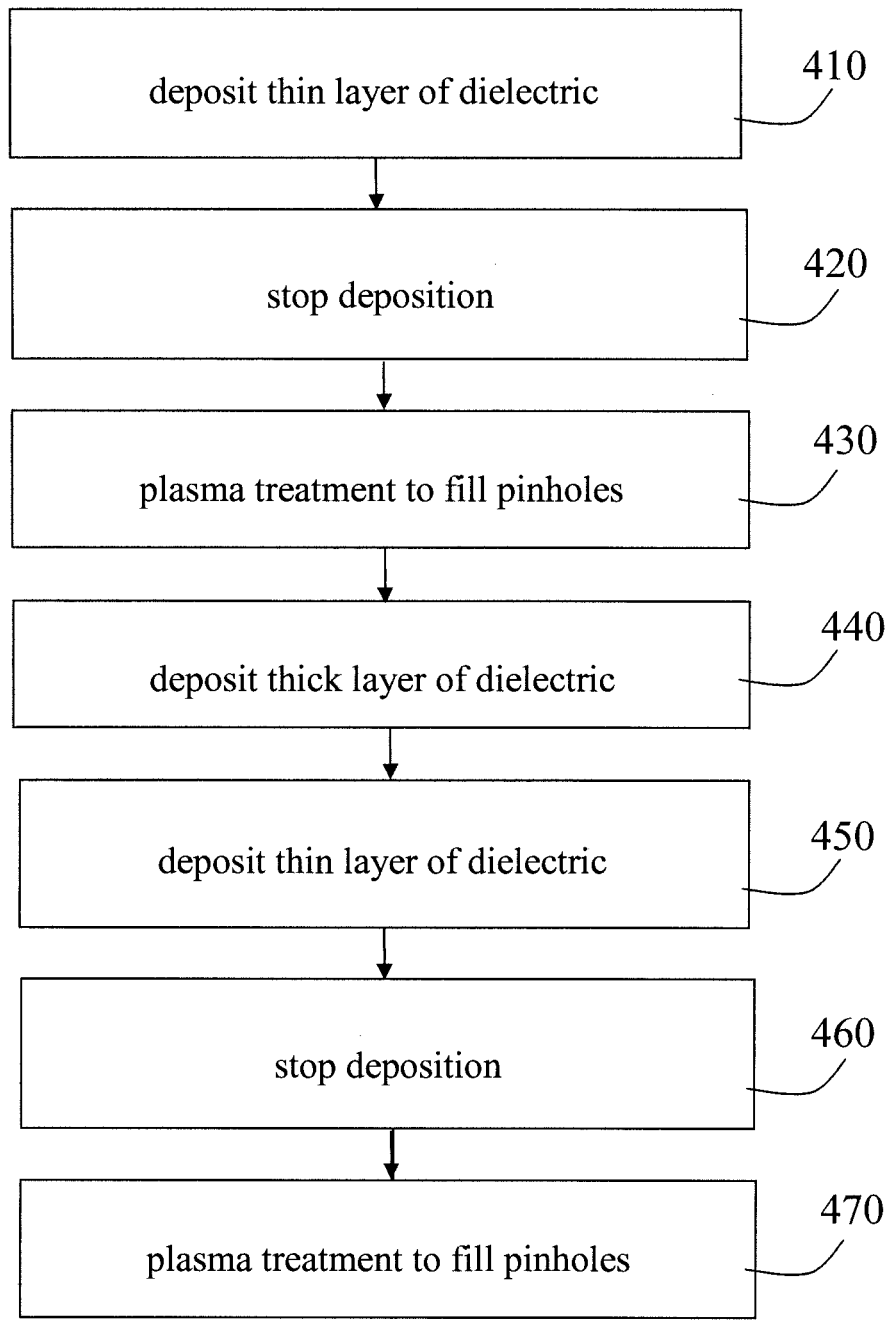
FIG. 4 is a flow chart for deposition of a LiPON thin film, according to further embodiments of the present invention.

A second embodiment of the present invention reduces the density of formed pinholes with post-deposition plasma induced surface modification according to the general process flow of FIG. 4. The process flow may include: deposition of a thin layer of high quality dielectric (410); stop deposition of the dielectric layer, and modify the gas in the chamber if desired (420); induce and maintain a plasma in the vicinity of the substrate to provide ion bombardment of the deposited layer of dielectric for restructuring the surface morphology of the dielectric layer and in some embodiments compositional modification, like nitrogen incorporation (430); deposition of a thick layer of lower quality dielectric (440); deposition of a thin layer of high quality dielectric (450); stop deposition of the dielectric layer, and modify the gas in the chamber if desired (460); and induce and maintain a plasma in the vicinity of the substrate to provide ion bombardment of the deposited layer of dielectric for restructuring the surface morphology of the dielectric layer and in some embodiments compositional modification, like nitrogen incorporation (470). The resulting overall layer of dielectric has a relatively uniform composition such that the ionic conductivity of the overall layer meets the device requirement. For example, the thin layers and thick layer are all LiPON layers such that the overall layer has the composition of LiPON with an ionic conductivity specified for TFB functionality. In step (440) the thick layer of dielectric may be deposited more rapidly than the thin layers to reduce process time, thus the thick layer is a lower quality dielectric—generally higher deposition rates for dielectrics result in more pinholes and surface roughness, which is certainly the case for LiPON. Although the dielectric must still be deposited under conditions that provide the required material specifications—for example, a thick LiPON layer in a TFB would need to be stable against dielectric breakdown. Here the assumption is that the thin layers at the top and bottom of the dielectric stack provide protection from shorting, so that pin holes in the thick layer are innocuous. Herein, the thick layer of dielectric refers to a layer of dielectric with a thickness of a few hundred nanometers to several microns or more, and more specifically to a layer of thickness 200 nm to 2 microns or more. Generally, the thickness of the thick layer of dielectric is determined by the breakdown voltage requirement of the device.

Further to the process of FIG. 4, a process that skips step 450 may be used. In this embodiment, pinholes in the thick film are repaired by the plasma treatment which may need to be of a longer duration than for the thinner high quality dielectric layer, although the actual plasma treatment time may not necessarily be longer. For example, the nitrogen plasma treatment time for a LiPON thick film may be optimized for filling pinholes, to increase the nitrogen content of the film, or some combination of both.

Figure 5A:
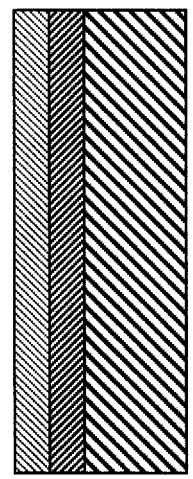
FIGS. 5A, 5B and 5C are a schematic illustration of pinhole removal during the plasma-only part of the deposition process, according to some embodiments of the present invention.
Figure 5B:
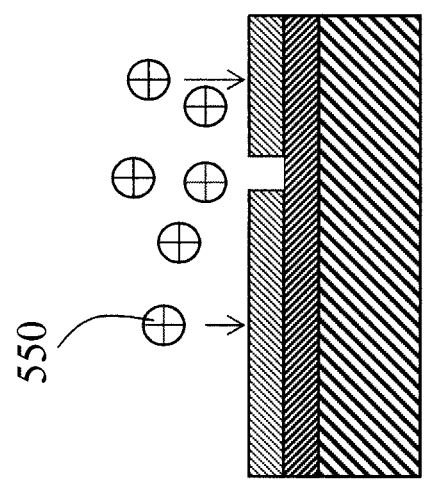
Figure 5C:
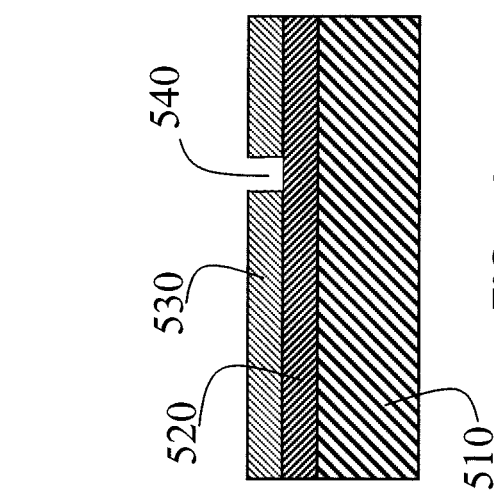

FIGS. 5A through 5C illustrate the process of pinhole repair by plasma treatment. In FIG. 5A a substrate 510 is covered by a metallic layer 520 and a dielectric layer 530. The dielectric layer 530 includes a pinhole 540. FIG. 5B shows the stack of FIG. 5A exposed to ions 550 from a plasma. The ions may be created in a plasma localized to the surface of the substrate, where a sufficient DC bias is applied to the substrate pedestal to attract the positive ions to the surface of the dielectric on the substrate with enough energy to (1) increase the surface mobility of adatoms and/or (2) sputter the surface atoms, which re-deposit on the surface of the dielectric layer. The effect of (1) and/or (2), along with a suitable selection of bias power and temperature, is surface modification and plugging of the pinholes, as shown in FIG. 5C.

Table 2 below shows some sample plasma recipes for LiPON deposition and plasma pinhole filling, according to some embodiments of the present invention carried out on an AMAT 200 mm Endura Standard Physical Vapor Deposition (PVD) chamber.

TABLE 2

| Variation | Ar Pressure (mTorr) | N₂ Pressure (mTorr) | RF Power (Watts) for 200 mm Tool† | Substrate Temperature (° C.) |
|---|---|---|---|---|
| Sputter Deposition A | 2-1000 | 2-1000 | 200-5000 | RT to 300 |
| Plasma Pinhole Filling A | 0 | 2-1000 | 0-1000 | RT to 300 |
| Sputter Deposition B | 0 | 2-1000 | 200-5000 | RT to 300 |
| Plasma Pinhole Filling B | 0 | 2-1000 | 0-1000 | RT to 300 |
| Sputter Deposition C | 2-1000 | 0 | 200-5000 | RT to 300 |
| Plasma Pinhole Filling C | 0 | 2-1000 | 0-1000 | RT to 300 |
| Sputter Deposition D | 2-1000 | 2-1000 | 200-5000 | RT to 300 |
| Plasma Pinhole Filling D | 2-1000 | 2-1000 | 0-1000 | RT to 300 |

†Upper limit of power is due to the limit of the power supply used and does not represent the upper limit for the process as determined by target area and power density limit of the target material. It is expected that the power may be increased up to the point at which target cracking begins.

Table 2 provides examples of process conditions for sputtering $Li_3PO_4$ to form thin films, followed by plasma pinhole removal to give LiPON thin films with low pinhole density. Process A is an example of sputter deposition in a nitrogen, argon ambient, followed by nitrogen plasma pinhole filling. Process B is an example of sputter deposition in a nitrogen ambient, followed by nitrogen plasma pinhole filling. Process C is an example of sputter deposition in an argon ambient, followed by nitrogen plasma pinhole filling. Process D is an example of sputter deposition in a nitrogen, argon ambient, followed by nitrogen, argon plasma pinhole filling. These are only some examples of the many varied process conditions that may be used. Note that the process scales to larger area tools. For example, an in-line tool with a 1400 mm×190 mm rectangular LiPON target has been operated at 10 kW. A large in-line target might operate with RF power that has an upper limit determined by the target area and the power density limit of the target material.

Furthermore, the process conditions may be varied from those described above. For example, for other materials such as $LiCoO_2$ the deposition temperature may be higher, the source power may be pDC, and the plasma treatment gas may be oxygen or an $Ar/O_x/N_2$ mixture. Those skilled in the art will appreciate after reading the present disclosure that adjustments of these parameters may be made to improve the uniformity of deposited films, surface roughness, layer density, etc., if required.

Although FIG. 2 shows a chamber configuration with horizontal planar target and substrate, the target and substrate may be held in vertical planes—this configuration can assist in mitigating particle problems if the target itself generates particles. Furthermore, the position of the target and substrate may be switched, so that the substrate is held above the target. Yet furthermore, the substrate may be flexible and moved in front of the target by a reel to reel system, the target may be a rotating cylindrical target, the target may be non-planar, and/or the substrate may be non-planar.

Furthermore, the above processes are described as being carried out in their entirety in a single deposition chamber. However, the deposition of the dielectric thin layer may be done in a first chamber and the plasma treatment in another.

Figure 6:
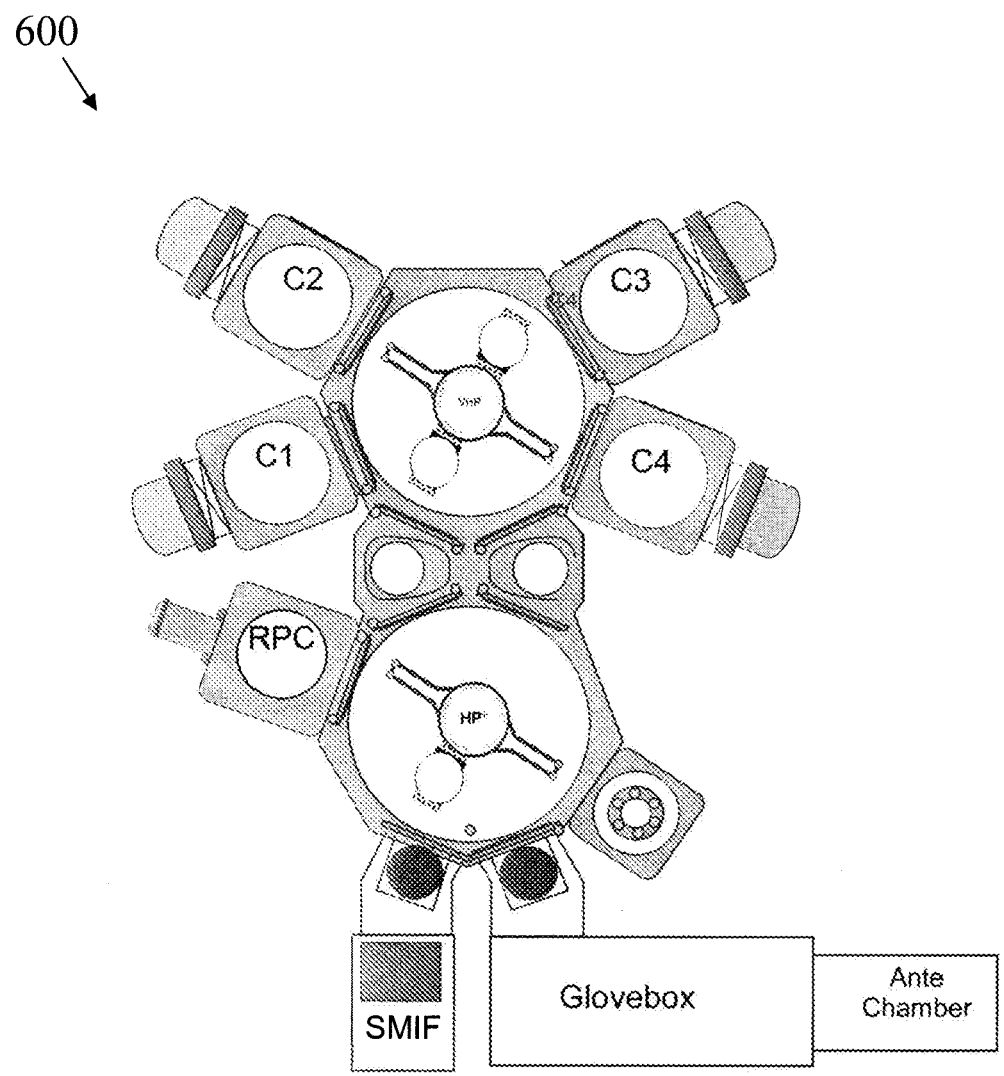
FIG. 6 is a schematic illustration of a thin film deposition cluster tool, according to some embodiments of the present invention.

FIG. 6 is a schematic illustration of a processing system 600 for fabricating a TFB device according to some embodiments of the present invention. The processing system 600 includes a standard mechanical interface (SMIF) to a cluster tool equipped with a reactive plasma clean (RPC) chamber and process chambers C1-C4, which may be utilized in the process steps described above. A glovebox may also be attached to the cluster tool if needed. The glovebox can store substrates in an inert environment (for example, under a noble gas such as He, Ne or Ar), which is useful after alkali metal/alkaline earth metal deposition. An ante chamber to the glovebox may also be used if needed—the ante chamber is a gas exchange chamber (inert gas to air and vice versa) which allows substrates to be transferred in and out of the glovebox without contaminating the inert environment in the glovebox. (Note that a glovebox can be replaced with a dry room ambient of sufficiently low dew point, as used by lithium foil manufacturers.) The chambers C1-C4 can be configured for process steps for manufacturing thin film battery devices which may include: deposition of an electrolyte layer (e.g. LiPON by RF sputtering a $Li_3PO_4$ target in $N_2$) and plasma pinhole filling, as described above. It is to be understood that while a cluster arrangement has been shown for the processing system 600, a linear system may be utilized in which the processing chambers are arranged in a line without a transfer chamber so that the substrate continuously moves from one chamber to the next chamber.

Figure 7:
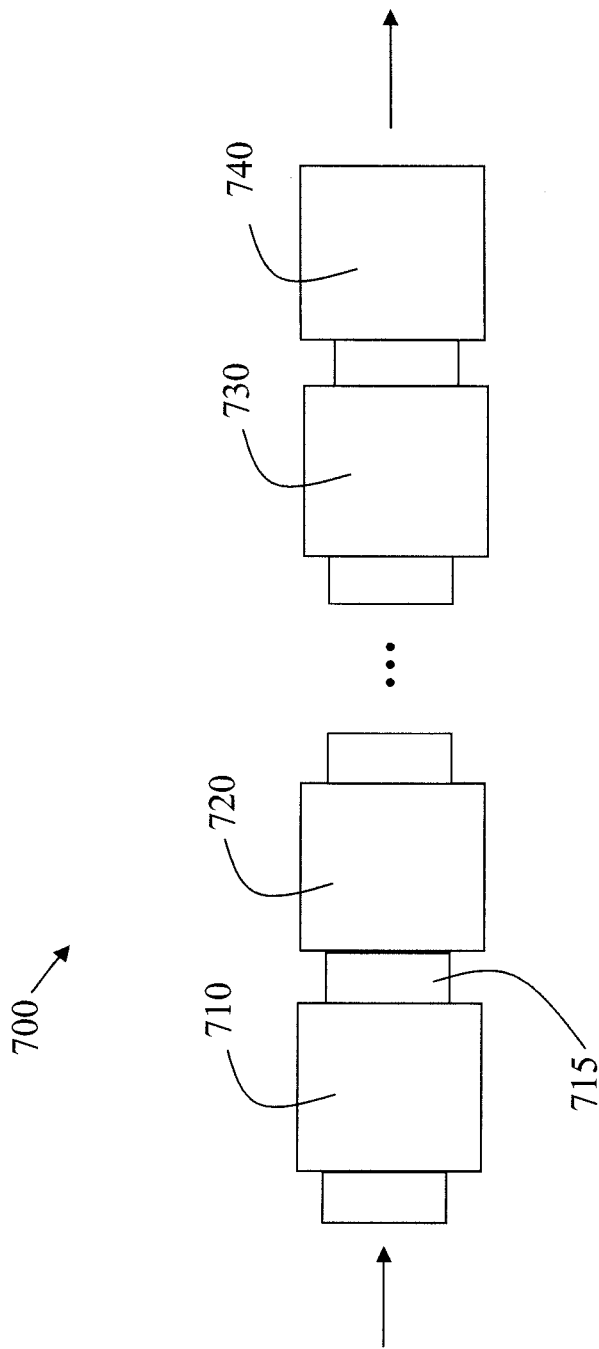
FIG. 7 is a representation of a thin film deposition system with multiple in-line tools, according to some embodiments of the present invention.

FIG. 7 shows a representation of an in-line fabrication system 700 with multiple in-line tools 710, 720, 730, 740, etc., according to some embodiments of the present invention. In-line tools may include tools for depositing all the layers of an electrochemical device—including both TFBs and electrochromic devices. Furthermore, the in-line tools may include pre- and post-conditioning chambers. For example, tool 710 may be a pump down chamber for establishing a vacuum prior to the substrate moving through a vacuum airlock 715 into a deposition tool 720. Some or all of the in-line tools may be vacuum tools separated by vacuum airlocks 715. Note that the order of process tools and specific process tools in the process line will be determined by the particular electrochromic device fabrication method being used. For example, one or more of the in-line tools may be dedicated to depositing a LiPON dielectric layer according to some embodiments of the present invention in which a plasma pinhole reduction process is used, as described above. Furthermore, substrates may be moved through the in-line fabrication system oriented either horizontally or vertically. Yet furthermore, the in-line system may be adapted for reel-to-reel processing of a web substrate.

Figure 8:
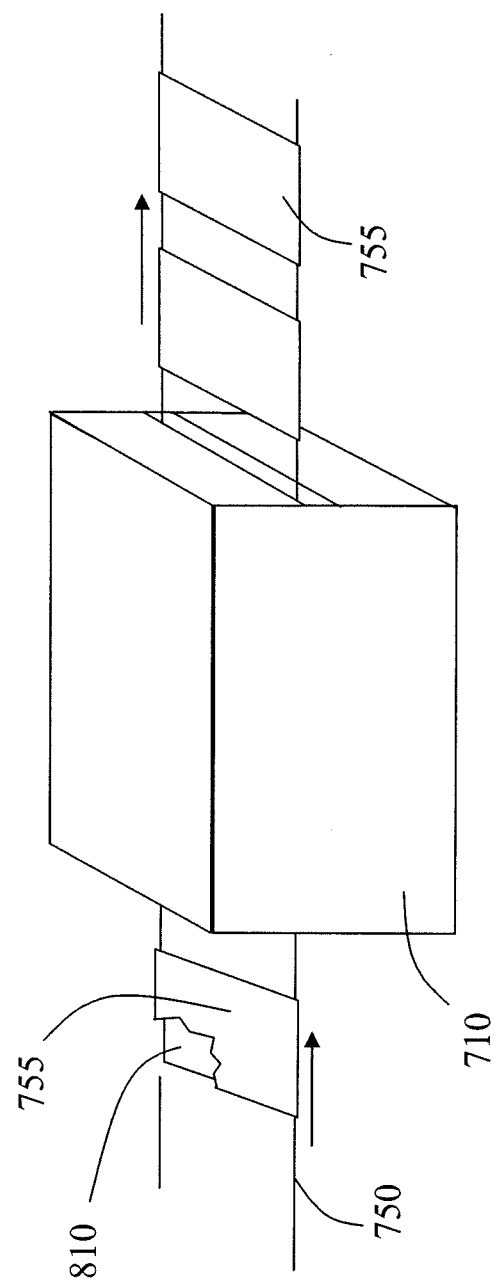
FIG. 8 is a representation of an in-line deposition tool, according to some embodiments of the present invention.

In order to illustrate the movement of a substrate through an in-line fabrication system such as shown in FIG. 7, in FIG. 8 a substrate conveyer 750 is shown with only one in-line tool 710 in place. A substrate holder 755 containing a substrate 810 (the substrate holder is shown partially cut-away so that the substrate can be seen) is mounted on the conveyer 750, or equivalent device, for moving the holder and substrate through the in-line tool 710, as indicated. A suitable in-line platform for processing tool 710 with vertical substrate configuration is Applied Materials' New Aristo™. A suitable in-line platform for processing tool 710 with horizontal substrate configuration is Applied Materials' Aton™. Furthermore, an in-line process can be implemented on a reel-to-reel system, such as Applied Materials' SmartWeb™

A first apparatus for depositing a dielectric thin film according to embodiments of the present invention may comprise a first system for: depositing a thin layer of dielectric; stopping deposition of the dielectric layer, and modifying the gas in the chamber if desired; inducing and maintaining a plasma in the vicinity of the substrate to provide ion bombardment of the deposited layer of dielectric; and repeating the depositing, stopping and inducing steps until a desired thickness of dielectric is deposited. However, the repeating of the depositing, stopping and inducing may be in second, third, etc. systems, depending on the number of repetitions required and the throughput required from the first apparatus. The first apparatus may be a cluster tool or an in-line tool. Furthermore, in an in-line or reel-to-reel apparatus the depositing and inducing steps may be carried out in separate, adjacent systems, and further pairs of systems for depositing and inducing steps may be added in-line as needed for repetitions of the depositing and inducing steps.

A second apparatus for depositing a dielectric thin film according to embodiments of the present invention may comprise: a first system for depositing a thin layer of high quality dielectric, stopping deposition of the dielectric layer, and modifying the gas in the chamber if desired, and inducing and maintaining a plasma in the vicinity of the substrate to provide ion bombardment of the deposited layer of dielectric; a second system for depositing a thick layer of lower quality dielectric; and a third system for depositing a thin layer of high quality dielectric, stopping deposition of the dielectric layer, and modifying the gas in the chamber if desired, and inducing and maintaining a plasma in the vicinity of the substrate to provide ion bombardment of the deposited layer of dielectric. However, the first, second and third systems, the first and second system or the second and third system may be a single system. The second apparatus may be a cluster tool or an in-line or reel-to-reel tool. Furthermore, when the second apparatus is a cluster tool, the first and third systems may be a single system.

Although the examples given above have focused on TFB and electrochromic devices, the principles and methods of the present invention may also apply to structures such as permeation barrier layers. Permeation barrier layers typically consist of multiple repeating layers of dielectric (or other vacuum deposited metal/semiconductor) and planarizing polymer films. The planarization layers are still permeable and thus the dielectric layer takes on the full permeation barrier function. As such, the processes of the present invention that minimize pinholes in the dielectric may be useful for such structures as well.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A method of depositing a dielectric film, comprising:
   sputter depositing a first layer of a dielectric material on a substrate;
   after said sputter depositing said first layer of said dielectric material, inducing and maintaining a plasma over said substrate to provide ion bombardment of said first layer of said dielectric material for reducing a density of pinholes in said first layer;
   sputter depositing a second layer of said dielectric material on the ion bombarded first layer of said dielectric material;
   after said sputter depositing said second layer of said dielectric material, and without inducing and maintaining a plasma over said substrate and not providing ion bombardment of said second layer of said dielectric material, sputter depositing a third layer of said dielectric material on said second layer of said dielectric material; and
   after said sputter depositing said third layer of said dielectric material, inducing and maintaining a plasma over said substrate to provide ion bombardment of said third layer of said dielectric material for reducing a density of pinholes in said third layer;
   wherein said vacuum depositing said first layer is in a first deposition system, said vacuum depositing said second layer is in a second deposition system and said vacuum depositing said third layer is in a third deposition system; and
   wherein said dielectric material is chosen from the group consisting of lithium phosphorous oxynitride and lithium cobalt oxide.

2. The method of claim 1, wherein said dielectric material is lithium phosphorus oxynitride.

3. The method of claim 1, wherein said second layer is deposited at a higher rate than said first layer and at a higher rate than said third layer.

4. The method of claim 1, wherein said dielectric material is lithium cobalt oxide.

5. The method of claim 1, wherein said first system and said second system are a single system.

6. The method of claim 1, wherein said first system and said third system are a single system and said single system and said second system are configured in a cluster tool.

7. The method of claim 1, wherein said first deposition system, said second deposition system and said third deposition system are adjacent systems in an in-line process system.

8. The method of claim 1, wherein said second layer is thicker than said first layer and thicker than said third layer.

9. The method of claim 8, wherein said second layer has a thickness in the range of 200 nm to 2 microns and said first layer and said third layer both have thicknesses in the range of 2 nm to 200 nm.

10. The method of claim 1, wherein said dielectric film is a dielectric film of an electrochemical device.

11. The method of claim 10, wherein said electrochemical device is a thin film battery.

12. The method of claim 1, wherein said second layer of dielectric material has a thickness of greater than 200 nanometers.

13. The method of claim 2, wherein said plasma is a nitrogen plasma.

14. The method of claim 2, wherein said sputter depositing is sputtering a $Li_3PO_4$ target in an argon ambient.

15. The method of claim 2, wherein said sputter depositing is sputtering a $Li_3PO_4$ target in a nitrogen ambient.

16. The method of claim 4, wherein said plasma is formed with an argon-oxygen-nitrogen gas mixture.

* * * * *

UNITED STATES PATENT AND TRADEMARK OFFICE
CERTIFICATE OF CORRECTION

PATENT NO. : 9,593,405 B2
APPLICATION NO. : 13/523790
DATED : March 14, 2017
INVENTOR(S) : Jiang et al.

It is certified that error appears in the above-identified patent and that said Letters Patent is hereby corrected as shown below:

On the Title Page

In item (56), under "OTHER PUBLICATIONS", in Column 2, Line 5, delete "15.4" and insert -- 15, 4 --, therefor.

On Page 2, in item (56), under "OTHER PUBLICATIONS", in Column 2, Line 1, delete "LiCoO2" and insert -- $LiCoO_2$ --, therefor.

In the Specification

In Column 1, Line 50, delete "UPON" and insert -- LiPON --, therefor.

In Column 1, Line 54, delete "UPON" and insert -- LiPON --, therefor.

In Column 1, Line 66, delete "UPON" and insert -- LiPON --, therefor.

In Column 1, Line 67, delete "UPON." and insert -- LiPON. --, therefor.

In Column 5, Line 51, delete "UPON" and insert -- LiPON --, therefor.

In Column 8, Line 65, delete "Web™" and insert -- Web™. --, therefor.

Signed and Sealed this
Fourth Day of July, 2017

Joseph Matal
*Performing the Functions and Duties of the*
*Under Secretary of Commerce for Intellectual Property and*
*Director of the United States Patent and Trademark Office*